United States Patent [19]
Kopec, Jr. et al.

[11] Patent Number: 6,034,541
[45] Date of Patent: Mar. 7, 2000

[54] IN-SYSTEM PROGRAMMABLE INTERCONNECT CIRCUIT

[75] Inventors: Stanley J. Kopec, Jr., Portland, Oreg.; Cheng-Yuan Michael Wang; Jerome Connelly Farmer, both of San Jose, Calif.; Cyrus Y. Tsui, Los Altos, Calif.

[73] Assignee: Lattice Semiconductor Corporation, Hillsboro, Oreg.

[21] Appl. No.: 08/838,487

[22] Filed: Apr. 7, 1997

[51] Int. Cl.[7] ........................................ G06F 7/38
[52] U.S. Cl. ................................. 326/39; 326/41
[58] Field of Search ................. 326/37, 38, 39, 326/40, 41

[56] References Cited

U.S. PATENT DOCUMENTS

| | | |
|---|---|---|
| 5,237,218 | 8/1993 | Josephson et al. . |
| 5,404,055 | 4/1995 | Shankar et al. ........................ 326/41 |
| 5,561,773 | 10/1996 | Kalish et al. .......................... 395/284 |
| 5,598,346 | 1/1997 | Agrawal et al. ........................ 326/39 |

FOREIGN PATENT DOCUMENTS 0 584 910 A1    3/1994    European Pat. Off. .

OTHER PUBLICATIONS

Agrawal, O.P.: "AMD'S Next Generation MACHTM3XX/4XX Family Breaks New PLD Density/Speed Barrier" Wescon Technical Papers, vol. 36, Nov. 17, 1992, pp. 100–106, XP000350080.

*Primary Examiner*—Michael Tokar
*Assistant Examiner*—Anh Q. Tran
*Attorney, Agent, or Firm*—Skjerven, Morrill, MacPherson, Franklin & Friel LLP; Edward C. Kwok

[57] ABSTRACT

A programmable interconnect circuit includes multiple input/output cells, each corresponding to an input/output pin, and a global routing resource for routing signals received at the input pins to be output as output signals at output and bi-directional pins. The signals routed in the global routing resource can include multiplexer control signals, clock signals and output enable signals for controlling dynamic signal switching. The global routing resource allows high static routability.

16 Claims, 4 Drawing Sheets

IN-SYSTEM PROGRAMMABLE INTERCONNECT CIRCUIT

BACKGROUND OF THE INVENTION

1. Field of the Invention

The present invention relates to programmable interconnect circuits. In particular, the present invention relates to programmable interconnect circuits that are optimized for both static signal routing and dynamic signal routing performances.

2. Discussion of the Related Art

Programmable interconnect circuits are used in three distinct classes of applications: programmable random signal interconnect (PRSI), programmable data path (PDP) and programmable switch replacement (PSR).

In a PRSI application, the programmable interconnect circuit is used at the printed circuit board (PCB) level for programmable signal routing. In this application, the interconnect circuit provides arbitrary signal swapping between integrated circuits on the PCB. Typically, in a PRSI application, the programmable interconnect circuit provides 1-to-1 pin connections which are statically configured, i.e. the signal path does not change in response to control input signals. The signals being routed are very often control signals routed between integrated circuits and their signal paths are often changed multiple times throughout the design process. Thus, a desirable programmable interconnect circuit suitable for supporting a PRSI application must have no restrictions on pin-to-pin signal routability.

In a PDP application, the programmable interconnect circuit performs data path transceiver, multiplexer, and register or latch functions. An example of such an application can be found in a microprocessor-based system, in which a 32-bit or 64-bit data bus is "steered" to memory and peripheral systems of various data width and timing constraints. Such an application requires capabilities for dynamically switched signal routing, data latching and data bus tri-stating. Unlike a PRSI application, however, the signal routing requirements for a PDP application are often formulated early in a design process, so that universal pin-to-pin signal routabilty is not as critical. In a PDP application, the desirable programmable interconnect circuit provides ample support for control of both dynamic signal routing and timing. It is also desirable to have such support as output enable signals, clock signals and minimization of the setup and hold time requirements.

Finally, in a PSR application, the programmable interconnect circuits act as solid state replacement and integration switches for mechanical switches and jumpers, which are often used to configure a system board. These switches are often re-set from time to time during the life time of the system board. Thus, in a PSR application, the programmable interconnect circuit is required to be reprogrammable during the life time s of the application.

SUMMARY OF THE INVENTION

The present invention provides a programmable interconnect circuit which includes: (i) a plurality of in-system programmable state elements for storing configuration data; (ii) a programmable global routing resource for receiving a first group of signals to provide a second group of signals as a result of routing the first group of signals through a switch matrix configured according to the configuration data stored in the state elements; and (iii) multiple input/output (I/O) circuits, each I/O circuit being associated with a pin of the programmable interconnect circuit.

In one embodiment, the I/O circuits are each programmable to be an output circuit, an input circuit, or a bidirectional circuit. When the I/O circuit is configured as an input circuit, the I/O circuit receives from the associated pin an input signal and provides that input signal to the global routing resource as one of that first group of signals. A register is provided to synchronize the input signal with a clock signal. When the I/O circuit is configured as an output circuit, the I/O circuit selects one signal from the second group of signals as an output signal of the associated I/O pin. The output signal can be provided as a latched or registered output signal, or an asynchronous output signal.

In accordance with one aspect of the present invention, the first and second groups of signals are each divided into multiple subgroups, e.g. first and second signal subgroups in the first group and third and fourth subgroups in the second group, the global routing resource routing (i) the signals in the first signal subgroup to the third signal subgroup in the second signal group, and (ii) the signals in the second signal subgroup to the fourth signal subgroup in the second signal group. In that embodiment, each I/O circuit receives a signal from the third signal subgroup and a signal from the fourth signal subgroup. Internally in the I/O circuit the output signal is selected from the signals received from the third and fourth subgroup. In this manner, i.e. global and local signal multiplexing, a signal on any input pin can be routed in the programmable interconnect circuit to any output pin, thereby imposing no restriction on routability. Further, by global and local signal multiplexing, the size of the global routing resource is thereby reduced, allowing routing of more I/O signals to be implemented for a given silicon real estate.

In one embodiment, in the programmable interconnect circuit of the present invention, the I/O circuit receives from the global routing resource signal a clock signal selected from one of the signals in the second signal group. Likewise, in the programmable interconnect circuit of the present invention, the I/O cell circuit receives from the global resource signal control signals, such as an output enable signal and multiplexer control signals, selected from signals routed in the global routing resource as the second signal group. These control signals ray originate from input signals on selected I/O pins.

In one embodiment, in the programmable interconnect circuit of the present invention, the I/O circuit includes a register clocked by a clock signal routed by the global routing resource. Alternatively, the I/O circuit can be provided global clock signals shared by any or all I/O circuits. In that embodiment, to minimize hold time, a delay element is provided for delaying arrival of data value received into a data register with respect to the selected clock signal.

In another embodiment, in the programmable interconnect circuit of the present invention, an I/O circuit includes an output buffer having programmable slew rates. A faster output slew rate provides faster pin-to-pin switching speed, while a slower pin-to-pin slew rate reduces noise in output signal switching.

By allowing signals to be routed through the global routing resource to be used as clock signals, output enable signals and multiplexer control signals in the I/O circuits, dynamic signal routing is easily implemented.

The present invention provides a programmable interconnect circuit which has maximum pin-to-pin routability to support, for example, PRSI applications. For example, in a development system using reprogrammable logic devices, a reprogrammable interconnect circuit of the present invention allows, when the pin assignment of signal in one of the reprogrammble logic device is changed, pin-locks at other re programmable logic circuits to be maintained. At the same time, the programmable interconnect circuit of the present invention provides maximum support for dynamically switched signal routing, data latching and data bus tristating, so as to be suitable for PDP applications. Further, this programmable interconnect circuit can be made in-system programmable, thus providing additional flexibility in all PRSI, PDP and PSR applications alike.

The present invention is better understood upon consideration of the detailed description below and the accompanying drawings.

BRIEF DESCRIPTION OF THE DRAWINGS

FIG. 3b is a schematic circuit 350 representing, in global routing pool 102 of programmable interconnect circuit 100, routing of signals received at I/O pin group 104a as signals 301a.

DETAILED DESCRIPTION OF THE PREFERRED EMBODIMENTS

Figure 1:
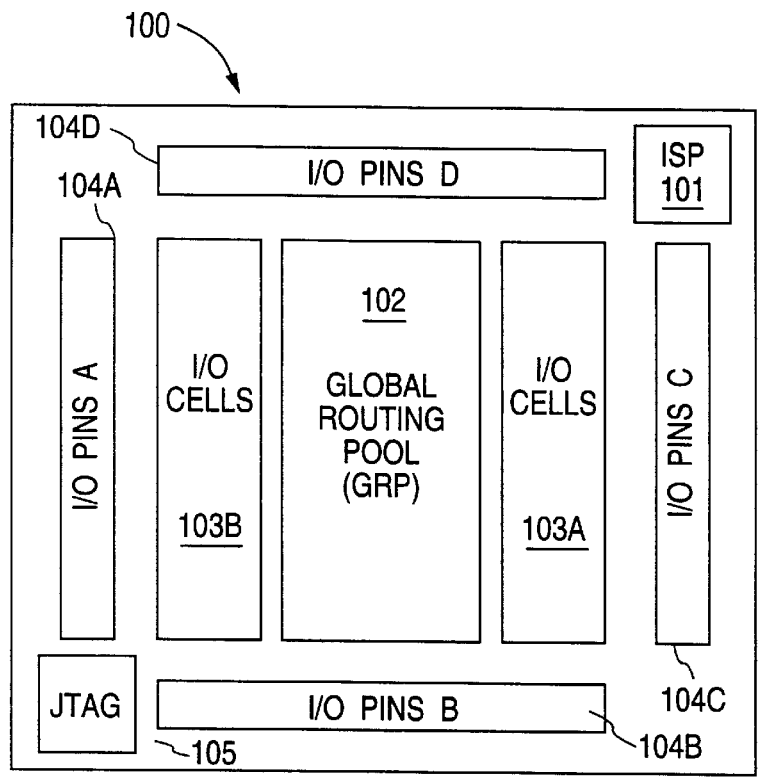
FIG. 1 shows the functional blocks of a programmable interconnect circuit 100, in one embodiment of the present invention.

The present invention is illustrated hereinbelow using, as an example, the programmable interconnect circuit of FIG. 1. FIG. 1 shows the functional blocks of such a programmable interconnect circuit 100, in one embodiment of the present invention.

As shown in FIG. 1, programmable interconnect circuit 100 is provided as an in-system programmable circuit. In-system programmable circuits are non-volatile programmable circuits, which can be electrically reprogrammed in-place, i.e. without removal from its operating environment to a programmer circuit. In-system programmable circuits are discussed, for example, in U.S. Pat. No. 5,237,218 to G. Josephson et al., filed on May 3, 1991 and issued on Aug. 17, 1993. The disclosure of U.S. Pat. No. 5,237,218 is hereby incorporated by reference in its entirety to provide background information regarding in-system programmable circuits. Functional block 101, labelled "ISP," represents the control and programming circuits for in-system programming programmable interconnect circuit 100.

In the implementation of programmable interconnect circuit 100 of FIG. 1, programmable interconnect circuit 100 is also provided boundary scan test capability compliant with the IEEE Std 1149.1 (the "JTAG standard"). The JTAG standard, which is set forth in *IEEE Standard Test Access Port and Boundary- Scan Architecture*, published by the Institute of Electrical and Electronics Engineers, Inc., (May 1990) is well-known to those in the art. Functional block 105, labelled "JTAG" represents the control and test circuits used in operations under the JTAG standard.

Figure 2:
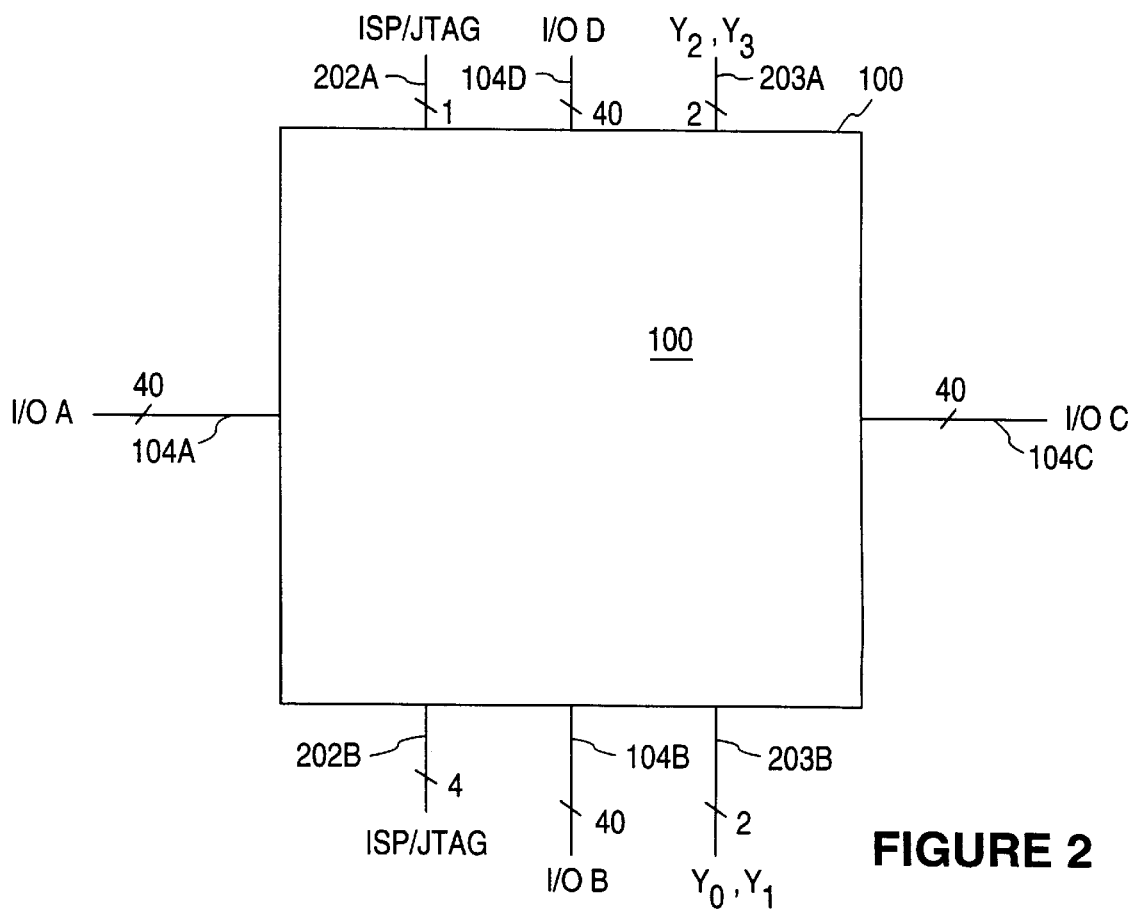
FIG. 2 illustrates the pin-out of programmable interconnect circuit 100 of FIG. 1.

Programmable interconnect circuit 100 is an integrated circuit which includes four groups of input/output (I/O) pins 104a, 104b, 104c, and 104d, respectively provided along the four sides of the integrated circuit die. Each I/O pin is associated with an I/O cell circuit, discussed in further detail below, which can be programmed to operate the I/O pin as an input pin, an output pin, or a bidirectional I/O pin with tristate capability. In FIG. 2, all I/O cell circuits are represented by functional blocks 103a and 103b, labelled "I/O cells." The signals of I/O cell functional blocks 103a and 103b are interconnected through global routing pool (GRP) 102 (labelled "GRP" in FIG. 1).

In the present description, to facilitate cross references between figures, like elements in the figures are assigned like reference numerals.

FIG. 2 illustrates the pin-out of programmable interconnect circuit 100 of FIG. 1. A number of power and ground pins (not shown) are provided to programmable interconnect pins to ensure that adequate and stable power supply voltages and currents are provided to operate programmable interconnect circuit 100. In this implementation, programmable interconnect circuit 100 supports 160 I/O cell circuits. Thus, four groups of I/O pins 104a, 104b, 104c and 100d, each including 40 I/O pins are provided along the four sides programmable interconnect circuit 100's integrated circuit die. In addition, four pins labelled $Y_0$, $Y_1$, $Y_2$ and $Y_3$ are received into programmable interconnect circuit 100 as four "global" clock signals, any one of which can be used to clock the state elements of any I/O cell circuit in programmable interconnect circuit 100. To support in-system programming (ISP) operations and the operations under the JTAG standard, control pins 202a and 202b are provided to support control and program/test data signals. In this embodiment, JTAG and ISP share the serial input signal, serial output signal, the clock signal an d the mode/TMS signal.

Figure 3A:
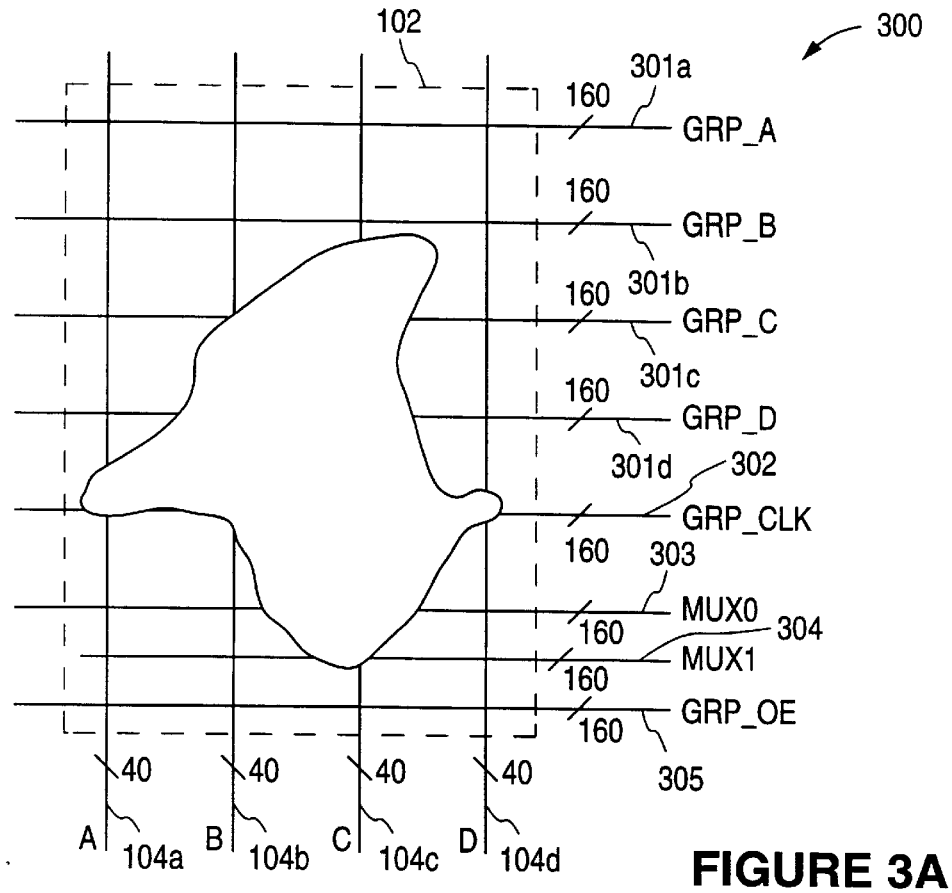
FIG. 3a is a schematic representation 300 of global routing pool 102 in programmable interconnect circuit 100.

FIG. 3a is a schematic representation 300 of global routing pool 102 in programmable interconnect circuit 100. As shown in FIG. 3a, an input signal received at an I/O pin of I/O pin group 104a can be routed by GRP 102 as any one of one hundred and sixty output signals 301a (labelled "GRP_A" in FIG. 3a). Each signal in signal group 301a is provided to one I/O cell circuit in each of the four I/O pin groups 104a, 104b, 104c and 104d. Likewise, an input signal received at an I/O pin of any of groups 104b, 104c and 104d can be routed by GRP 102 as any one of one hundred and sixty output signals in the corresponding signal group 301b, 301c or 301d (labelled "GRP_B", "GRP_C", and "GRP_D", respectively, in FIG. 3a). Similarly, each signal in signal groups 301b, 301c and 301d is provided to one I/O cell circuit in each of the four I/O pin groups 104a, 104b, 104c and 104d. Within each I/O cell circuit, the four signals from signal groups 301a, 301b, 301c and 301d can then be selected internally as the output signal of the I/O cell circuit. In this manner, any signal in at any I/O pin can be routed as the output signal of any I/O pin. Thus, unrestricted pin-to-pin signal routing is achieved.

FIG. 3a also shows that the signals on one-quarter of the I/O pins, ten from each of I/O pin groups 104a, 104b, 104c and 104d, can each be received as a clock signal and be routed to any of the 160 I/O cell circuits as a clock signal (clock signals 302, labelled "GRP_CLK") for clocking the state elements of that I/O cell circuit. The signals on another forty I/O pins, ten from each of I/O pin groups 104a, 104b, 104c and 104d, can each be received as a multiplexer control signal and be routed to any of the one hundred and sixty I/O cell circuits as a multiplexer control signal (multiplexer control signals 303, labelled "MUX0") for controlling the multiplexing within the I/O cell circuit. Likewise, the signals on another forty I/O pins, ten from each of I/O pin groups 104a, 104b, 104c and 104d, can each be received as a multiplexer control signal and be routed to all one hundred and sixty I/O cell circuits as a multiplexer signal (multiplexer control signals 304, labelled "MUX1") for controlling the multiplexing within the I/O cell circuit. The signals on the remainder one-quarter of the I/O pins, ten from each of I/O pin groups 104a, 104b, 104c and 104d, can each be received as an output enable signal and be routed to any of the 160 I/O cell circuits as an output enable signal (output enable signals 305, labelled "GRP_OE") for enabling the output amplifier of the I/O cell circuit. If any output terminal of GRP 102 is not driven, the output signal at that output terminal is defaulted to '1'.

Figure 3B:
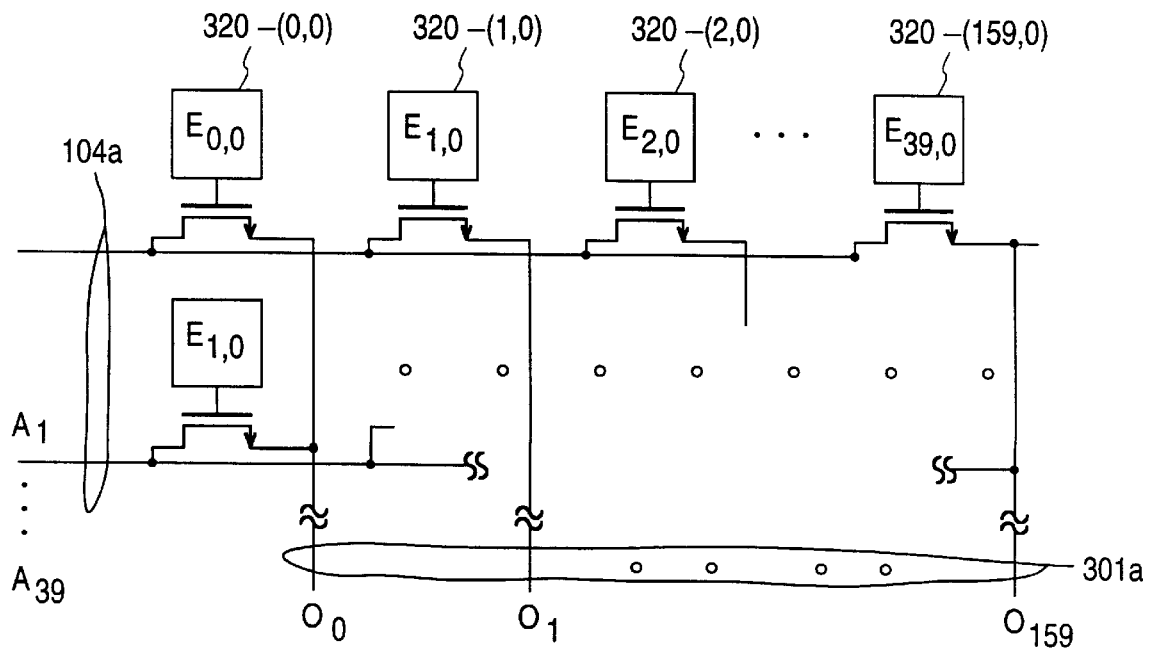

FIG. 3b is a schematic circuit 350 representing, in global routing pool 102 of programmable interconnect circuit 100, routing of signals received in I/O pin group 104a as output signals 301a. As shown in FIG. 3b, circuit 350 includes an array of 40×160 pass or transfer transistors each controlled by a 1-bit memory cell. The 1-bit memory cells are shown in FIG. 3b as memory cells 320-(0,0), 320-(1,0), 320-(2,0) ... 320-(159,0), 320-(0,1), ..., 320-(159,39), forming a cross bar switch for routing any signal in I/O pin group 104a as any of the signals in signals 301a. These 1-bit memory cells are electrically erasable programmable read-only memory (E$^2$PROM) elements, programmable using in-system programming techniques. Thus, global routing pool 102 implements static routing. Other portions of global routing pool 102 can be similarly implemented.

Figure 4:
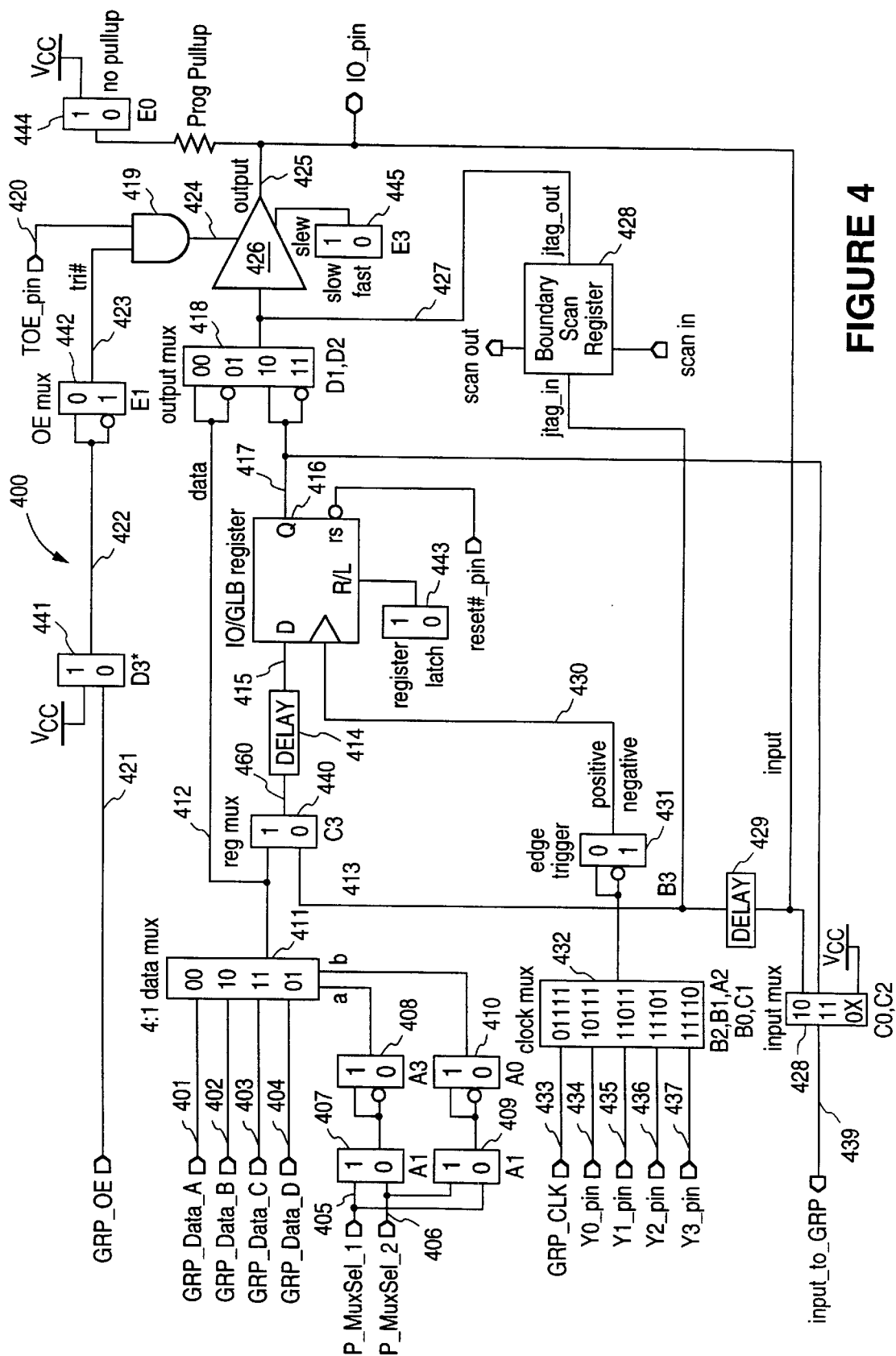
FIG. 4 is a schematic diagram of input/output (I/O) circuit 400 used in association with each I/O pin of programmable interconnect circuit 100.

FIG. 4 is a schematic diagram of input/output (I/O) cell circuit 400 used in association with each I/O pin of programmable interconnect circuit 100. As shown in FIG. 4, I/O cell circuit 400 receives four input data signals from GRP 102 at terminals 401, 402, 403 and 404, which are respectively signals selected from signal groups 301a, 301b, 301c and 301d. I/O cell circuit 400 also receives from GRP 102 (i) an output enable signal at terminal 421, which is an output enable signal selected from output enable signals 305 (GRP_OE), (ii) a clock signal at terminal 433, which is a signal selected from clock signals 302 (GRP_CLK), and (iii) two multiplexer control signals at terminal 405 and 406, which are signals selected from multiplexer control signals 303 (MUX0) and multiplexer control signals 304 (MUX1) respectively. I/O cell circuit 400 also receives global clock signals Y$_0$, Y$_1$, Y$_2$ and Y$_3$ at terminals 434, 435, 436 and 437 respectively.

If I/O cell circuit 400 is configured as an output cell, or if the output signal is to be enabled by the output enable signal at terminal 421, multiplexers 441 and 442 are appropriately selected to enable output amplifier 426 by providing the output enable signal at terminal 424. Gate 420 allows a test output enable signal (labelled "TOE") to globally disable all I/O pins. The multiplexer control signals at terminals 405 and 406 are s used to select one of the four input data signals 40L, 402, 403 and 404 at 4-1 multiplexer 411. The signal output from multiplexer 411 is provided at terminal 412. Multiplexers 407 and 409 are provided to allow swapping of the multiplexer control signals at terminals 405 and 406, if desired. Multiplexers 408 and 409 select the signal polarity of the multiplexer control signals at multiplexer 411. The signal at terminal 412 can be provided through amplifier 426 as I/O cell circuit 400's output signal at terminal 425. The output signal at terminal 425 is synchronous, if the signal at terminal 412 is latched into register 416, through multiplexer 440 and delay element 414. Otherwise, the output signal at terminal 425 is asynchronous, being selected by multiplexer 418 from terminal 412. Multiplexer 418 is a 4-1 multiplexer, selecting both the polarity and the synchronicity of the output signal at terminal 425. The output signal at terminal 425 is provided pull-up if so configured in multiplexer 444. In the implementation shown in have one of two slew rates by setting multiplexer 445.

I/O cell circuit 400 can also be configured as an input cell by properly disabling output amplifier 426 by appropriately selecting multiplexer 441 and 442 to ensure a negated output enable signal at terminal 424. The input signal at terminal 425 is provided by multiplexer 438 at terminal 439 to GRP 102, either synchronously or asynchronously. The asynchronous signal is selected from terminal 425 directly. The synchronous signal is provided by register 416 which receives, in this instance, the input signal at terminal 425 delayed by delay elements 429 and 414. When I/O cell circuit 400 is used as an input cell, multiplexer 440 is set to select the signal at terminal 413.

Register 416 is controlled by a clock signal at terminal 430, which is provided by 5-1 multiplexer selecting one of the clock signals at terminals 433–437. Multiplexer 431 selects controls whether register 416 latches at a rising edge or a falling edge. To ensure hold time is minimized, delay elements 414 and 429 are provided to achieve proper timing relationship between the data signal at terminal 415 and the clock signal at terminal 430. Multiplexer 443 selects whether register 416 is to operate under register mode (i.e. edge triggered) or latch mode (i.e. transparent).

Multiplexers 407–410, 418, 431–432, 438, and 440–445 are configured using in-system programming techniques, the selection signals of these multiplexers being stored in configuration registers of the E$^2$PROM technology discussed above.

Figure 5:
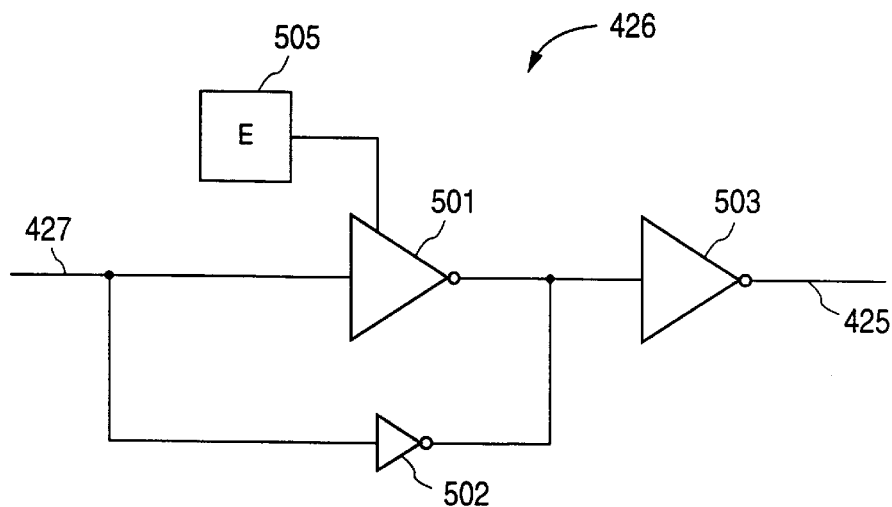
FIG. 5 is a schematic circuit of adjustable slew rate output amplifier 426.

As discussed above, the slew rate of output amplifier 426 can be programmed. FIG. 5 is a schematic circuit of output amplifier 426. As shown in FIG. 5, output amplifier 426 includes buffers 501, 502 and 503, and configuration circuit 505, which includes multiplexer 445 and a configuration register. Buffers 501 and 502 drives buffer 503 in parallel. Buffer 551, which is enabled by storing an appropriate value in the configuration register of configuration circuit 505, is designed to have a faster rise time than buffer 502. Thus, when buffer 501 is enabled, the output signal of buffer 503 at terminal 425 has a faster rise time.

Figure 6:
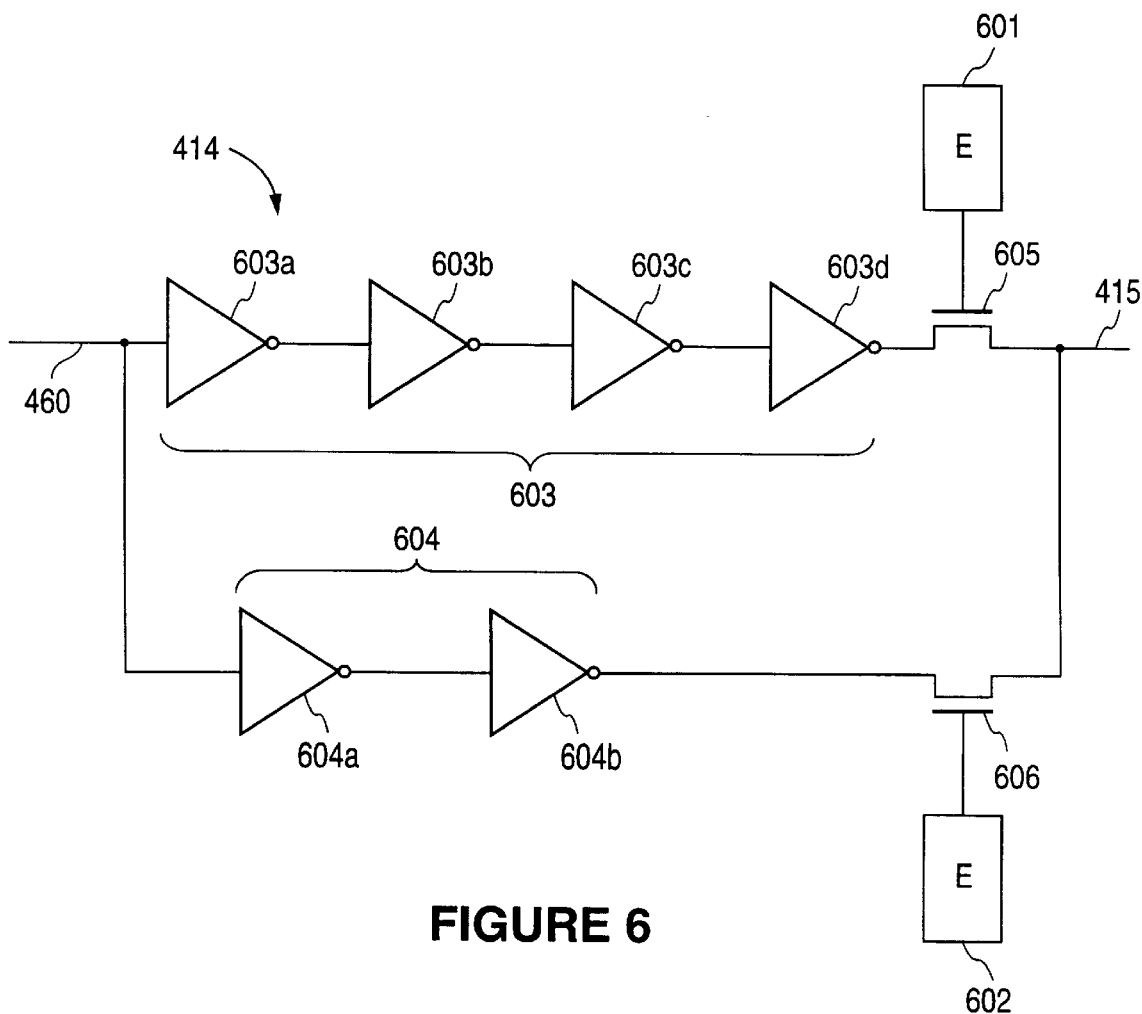
FIG. 6 is a schematic circuit of programmable delay circuit 414 of I/O cell circuit 400.

As mentioned above, hold time is minimized by inserting delay elements 429 and 414. FIG. 6 is a schematic circuit of programmable delay circuit 414 of I/O circuit 400. As shown in FIG. 6, delay element 414, which is placed across terminals 460 and 415, includes two signal paths 603 and 604, controlled respectively by pass or transfer transistors 605 and 606. Transfer transistors 605 and 606 are enabled by configuration registers 601 and 602 of the above-mentioned E$^2$PROM technology and are programmed using in-system programming techniques. The longer signal path 603 is enabled when the clock signal selected at multiplexer 432 is the clock signal at terminal 433, which is routed by GRP 102. However, if the clock signal selected at multiplexer 432 is a global clock, i.e. any of the clock signals at terminals 434–437, the shorter signal path 604 is selected. Delay element 429 can be likewise implemented.

The above detailed description is provided to illustrate specific embodiments of the present invention and is not intended to be limiting. Numerous variations and modifications within the scope of the present invention are possible. The present invention is set forth in the appended the claims.

We claim:

1. A programmable interconnect circuit, comprising:

a plurality of state elements for storing configuration data;

a programmable global routing resource for receiving a first plurality of signals to provides a second plurality of signals, said second plurality of signals provided as a result of routing said first plurality of signals through a cross-bar switch matrix configured according to said configuration data stored in said elements; and a plurality of input/output (I/O) circuits, each I/O circuit being associated with a pin of said programmable interconnect circuit, said I/O circuits each being programmable to be an output circuit, an input circuit, or a bidirectional circuit, wherein when said I/O circuit is configured as an input circuit, said I/O circuit receives from said associated pin an input signal and provides said input signal to said global routing resource as one of said first plurality of signals, and wherein when said I/O circuit is configured as an output circuit, said I/O circuit selects one of said second plurality of signals as an output signal of said associated I/O pin.

2. A programmable interconnect circuit as in claim 1, wherein (i) said first plurality of signals is divided into subgroups of signals, and (ii) each I/O circuit receives a predetermined number of data signals, each data signal being routed from a different subgroup of said first plurality of signals.

3. A programmable interconnect circuit as in claim 1, wherein each of said I/O circuit receives from said global resource signal a clock signal selected from one of said second plurality of signals.

4. A programmable interconnect circuit as in claim 1, wherein each of said I/O circuit receives from said global resource signal an output enable signal selected from one of said second plurality of signals.

5. A programmable interconnect circuit as in claim 2, wherein said I/O circuit selects as said output signal one of said data signals.

6. A programmable interconnect circuit as in claim 5, wherein each of said I/O circuit receives from said global resource signal a multiplexer control signal selected from one of said second plurality of signals, and wherein said I/O circuit selects said output signal in accordance with the value of said control signal.

7. A programmable interconnect circuit as in claim 1, said I/O circuit including a register receiving a data value and a clock signal.

8. A programmable interconnect circuit as in claim 7, wherein said I/O circuit further comprising a delay element for delaying arrival of said data value with respect to said clock signal.

9. A programmable interconnect circuit as in claim 7, wherein said clock signal is selected from said second plurality of signals.

10. A programmable interconnect circuit as in claim 7, wherein said clock signal is selected from one of said second plurality of signals and a clock signal received at a pin of said programmable interconnect circuit.

11. A programmable interconnect circuit, comprising:

a plurality of state elements for storing configuration data;

a programmable global routing resource for receiving a first plurality of signals to provide a second plurality of signals, said second plurality of signals provided as a result of routing said first plurality of signals through a switch matrix configured according to said configuration data stored in said elements; and a plurality of input/output (I/O) circuits, each I/O circuit being associated with a pin of said programmable interconnect circuit, said I/O circuit being programmable to be an output circuit, an input circuit, or a bidirectional circuit, wherein when said I/O circuit is configured as an input circuit, said I/O circuit receives from said associated pin an input signal and provides said input signal to said global routing resource as one of said first plurality of signals, and wherein when said I/O circuit is configured as an output circuit, said I/O circuit selects one of said second plurality of signals as an output signal of said associated I/O pin, said I/O circuit including a register receiving a data value and a clock signal wherein said I/O circuit further comprising a delay element for delaying arrival of said data value with respect to said clock signal, said delay element having a delay value selectable in accordance with whether said clock signal is selected from one of said second plurality of signals or a clock signal received at a pin of said programmable interconnect circuit.

12. A programmable interconnect circuit as in claim 7, said register receiving a data value selected from one of said second plurality of signals and said first plurality of signals.

13. A programmable interconnect circuit, comprising:

a plurality of state elements for storing configuration data;

a programmable global routing resource for receiving a first plurality of signals to provide a second plurality of signals, said second plurality of signals provided as a result of routing said first plurality of signals through a switch matrix configured according to said configuration data stored in said elements; and a plurality of input/output (I/O) circuits, each I/O circuit being associated with a pin of said programmable interconnect circuit, said I/O circuit being programmable to be an output circuit, an input circuit, or a bidirectional circuit, wherein when said I/O circuit is configured as an input circuit, said I/O circuit receives from said associated pin an input signal and provides said input signal to said global routing resource as one of said first plurality of signals, and wherein when said I/O circuit is configured as an output circuit said I/O circuit selects one of said second plurality of signals as an output signal of said associated I/O pin, said I/O circuit including a register receiving a data value and a clock signal, said register receiving a data value selected from one of said second plurality of signals and said first plurality of signals, said I/O circuit further comprising a delay element for delaying arrival of said data value with respect to said clock signal, said delay element having a delay value selected according to whether said data value is selected from one of said second plurality of signals or said first plurality of signals.

14. A programmable interconnect circuit as in claim 1, wherein said I/O circuit includes an output buffer having programmable slew rates.

15. A programmable interconnect circuit as in claim 1, wherein said state elements including electrically erasable programmable read-only memory elements.

16. A programmable interconnect circuit as in claim 1, wherein said state elements are in-system programmable.

* * * * *